(12) United States Patent
Olieman et al.

(10) Patent No.: US 10,938,401 B1
(45) Date of Patent: Mar. 2, 2021

(54) ANALOG-TO-DIGITAL CONVERTER, RESISTIVE DIGITAL-TO-ANALOG CONVERTER CIRCUIT, AND METHOD OF OPERATING AN ANALOG-TO-DIGITAL CONVERTER

(71) Applicant: NXP B.V., Eindhoven (NL)

(72) Inventors: Erik Olieman, Waalre (NL); Alphons Litjes, Zijtaart (NL); Ibrahim Candan, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/693,557

(22) Filed: Nov. 25, 2019

(51) Int. Cl.
  *H03M 1/00* (2006.01)
  *H03M 1/46* (2006.01)
  *H03M 1/42* (2006.01)
  *H03M 1/80* (2006.01)
  *H03M 1/78* (2006.01)
  *H03M 1/68* (2006.01)

(52) U.S. Cl.
  CPC .............. *H03M 1/462* (2013.01); *H03M 1/42* (2013.01); *H03M 1/68* (2013.01); *H03M 1/785* (2013.01); *H03M 1/802* (2013.01); *H03M 1/808* (2013.01)

(58) Field of Classification Search
  CPC ........... H03M 1/462; H03M 1/42; H03M 1/68
  USPC ................ 341/144, 155, 156, 163, 172, 126
  See application file for complete search history.

(56) References Cited

U.S. PATENT DOCUMENTS

| 9,124,288 B2* | 9/2015 | Umezaki | H03M 1/109 |
| 2003/0234736 A1* | 12/2003 | Tachibana | H03M 1/68 341/172 |
| 2015/0318853 A1 | 11/2015 | Mccollum | |

OTHER PUBLICATIONS

Steensgaard, Jesper, "Bootstrapped Low-Voltage Analog Switches"; Proceedings of IEEE International Symposium on Circuits and Systems VLSI, vol. 2, Orlando, FL, USA 4 pages (1999).

Sedighi, Behnam et al. "Design of Hybrid Resistive-Capacitive DAC for SAR A/D Converters"; IEEE International Conference on Electronics, Circuits, and Systems, Seville; 4 pages (2012).

* cited by examiner

*Primary Examiner* — Peguy Jean Pierre

(57) ABSTRACT

Embodiments of an analog-to-digital converter (ADC), resistive digital-to-analog converter (DAC) circuits, and methods of operating an ADC are disclosed. In an embodiment, an analog-to-digital converter includes a DAC unit configured to convert a digital code to a first voltage in response to an input voltage of the ADC, a comparator configured to compare the first voltage with a second voltage to generate a comparison output, and a logic circuit configured to generate the digital code, to control the DAC unit based on the comparison output, and to output the digital code as a digital output of the ADC. The DAC unit includes a capacitive DAC and multiple resistive DACs. Each of the resistive DACs is connected to the first voltage through a respective capacitor.

19 Claims, 5 Drawing Sheets

ANALOG-TO-DIGITAL CONVERTER, RESISTIVE DIGITAL-TO-ANALOG CONVERTER CIRCUIT, AND METHOD OF OPERATING AN ANALOG-TO-DIGITAL CONVERTER

BACKGROUND

Analog-to-digital converters (ADCs) convert analog signals into digital signals. For example, a successive-approximation-register (SAR) ADC is one type of analog-to-digital converter that can convert a continuous analog waveform into a discrete sequence via a binary search through all possible quantization levels for each conversion. However, switching circuits (e.g., transmission gates) within an ADC may not function properly across certain voltage ranges. Therefore, there is a need for ADC technology that can avoid certain undesirable voltage ranges to promote reliable operations of the switching circuits.

SUMMARY

Embodiments of ADCs, resistive digital-to-analog converter (DAC) circuits, and methods of operating an ADC are disclosed. In an embodiment, an analog-to-digital converter includes a DAC unit configured to convert a digital code to a first voltage in response to an input voltage of the ADC, a comparator configured to compare the first voltage with a second voltage to generate a comparison output, and a logic circuit configured to generate the digital code, to control the DAC unit based on the comparison output, and to output the digital code as a digital output of the ADC. The DAC unit includes a capacitive DAC and multiple resistive DACs. Each of the resistive DACs is connected to the first voltage through a respective capacitor.

In an embodiment, the resistive DACs share a resistor ladder.

In an embodiment, the resistive DACs are connected to the capacitive DAC through switches.

In an embodiment, the resistive DACs are connected to the capacitive DAC through a single switch.

In an embodiment, each of the resistive DACs includes a plurality of transmission gates connected to different resistors of the resistor ladder.

In an embodiment, each of the transmission gates includes an NMOS transistor and a PMOS transistor.

In an embodiment, the capacitive DAC is configured to performs most significant bit (MSB) conversion of the digital code.

In an embodiment, the resistive DACs are configured to perform least significant bit (LSB) conversion of the digital code.

In an embodiment, the capacitive DAC includes switches connected to the input voltage of the ADC or a reference voltage of the ADC and capacitors connected between the switches and the first voltage.

In an embodiment, the capacitive DAC further includes a bootstrap controller configured to control some of the switches simultaneously.

In an embodiment, the ADC further includes a second DAC unit configured to convert the digital code to the second voltage in response to the input voltage of the ADC. The second DAC unit includes a second capacitive DAC and a second set of resistive DACs, and each of the second set of resistive DACs is connected to the second voltage through a respective capacitor.

In an embodiment, the second set of resistive DACs share a second resistor ladder.

In an embodiment, the second set of resistive DACs are connected to the capacitive DAC through switches.

In an embodiment, the second set of resistive DACs are connected to the capacitive DAC through a single switch.

In an embodiment, each of the second set of resistive DACs includes transmission gates connected to different resistors of the second resistor ladder.

In an embodiment, each of the transmission gates includes an NMOS transistor and a PMOS transistor.

In an embodiment, the ADC is a successive-approximation-register (SAR) ADC.

In an embodiment, a resistive DAC circuit includes resistive DACs, where the resistive DACs share a resistor ladder, and where each of the resistive DACs is connected to a common voltage link through a respective capacitor.

In an embodiment, a method for operating an ADC involves converting a digital code to a first voltage in response to an input voltage of the ADC using a DAC unit, comparing the first voltage with a second voltage to generate a comparison output; and controlling the DAC unit based on the comparison output and outputting the digital code as a digital output of the ADC. The DAC unit includes a capacitive DAC and a plurality of resistive DACs, and each of the resistive DACs is connected to the first voltage through a respective capacitor.

In an embodiment, the ADC is a SAR ADC.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
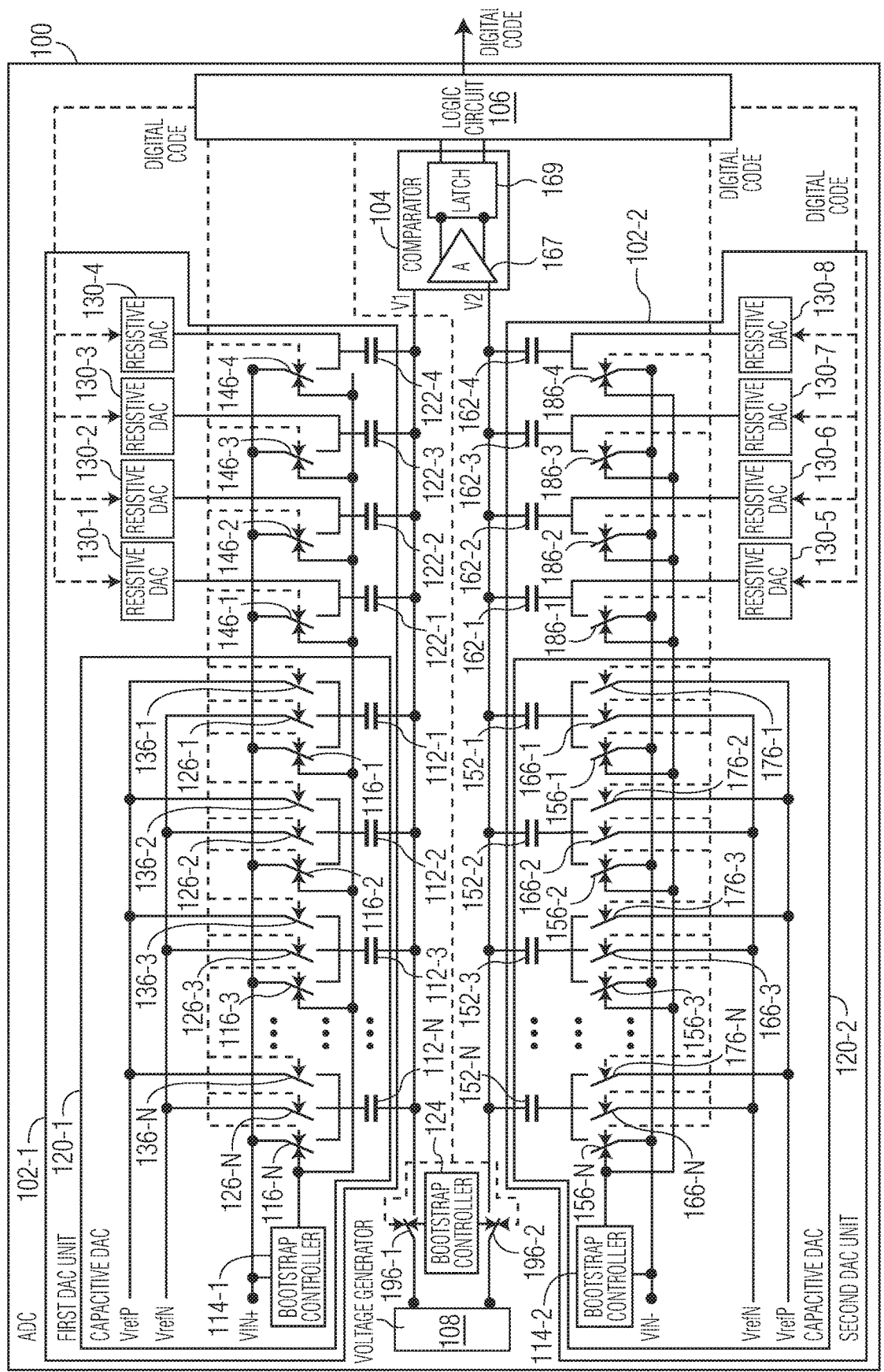
FIG. 1 depicts an ADC in accordance with an embodiment of the invention.

FIG. 1 depicts an ADC 100 in accordance with an embodiment of the invention. In the embodiment depicted in FIG. 1, the ADC includes a first DAC unit 102-1, a second DAC unit 102-2, a comparator 104 connected to the first and second DAC units, a logic circuit 106, and a voltage generator 108. The ADC can be used to convert analog signals (e.g., input voltages) into digital signals (e.g., digital codes or codewords). The ADC can be used in various applications, such as automotive applications, communications applications, industrial applications, medical applications, computer applications, and/or consumer or appliance applications. Although the ADC 100 is shown with certain components and described with certain functionality herein, other embodiments of the ADC may include fewer or more components to implement the same, less, or more functionality. For example, although the ADC is shown in FIG. 1 as including two DAC units, in other embodiments, the ADC may include a single DAC unit or more than two DAC units. In some embodiments, components of the ADC are implemented on a single substrate (e.g., integrated into the same IC chip) or distributed on multiple substrates (e.g., implemented on multiple IC chips). For example, at least one of the first DAC unit, the second DAC unit, the comparator, the logic circuit, the voltage generator, and the bootstrap controller is implemented on a single substrate (e.g., integrated into one IC chip) or distributed on multiple substrates (e.g., implemented on multiple IC chips). In another example, although the ADC is shown in FIG. 1 as including the voltage generator, in other embodiments, the voltage generator is external to the ADC (e.g., located at a separate IC chip from the ADC). In some embodiments, the ADC is a SAR ADC that can convert a continuous analog waveform into a discrete sequence via a binary search through all possible quantization levels for each conversion.

The first DAC unit 102-1 of the ADC 100 is configured to convert a digital code that is generated by the logic circuit 106 to a first voltage, $V_1$, in response to an input voltage, $V_{IN+}$, of the ADC. In the embodiment depicted in FIG. 1, the first DAC unit 102-1 is a hybrid DAC unit that includes a capacitive DAC 120-1 and four resistive DACs 130-1, 130-2, 130-3, 130-4. Compared to a DAC unit that includes only capacitive DAC or capacitive DACs, a hybrid DAC unit uses less capacitors and less substrate area. For example, for a 12-bit capacitive DAC, 4095 unit cells may be needed, which may be impractical for various applications. In the embodiment depicted in FIG. 1, the capacitive DAC 120-1 and the four resistive DACs 130-1, 130-2, 130-3, 130-4 perform conversation for different bit sections/position of a digital sequence. For example, the capacitive DAC 120-1 performs most significant bit (MSB) conversion and the four resistive DACs 130-1, 130-2, 130-3, 130-4 perform least significant bit (LSB) conversion. The capacitive DAC includes a set of capacitors 112-1, ..., 112-N, where N is an integer that is greater than one, a bootstrap controller 114-1, a first set of switches 116-1, ..., 116-N that are controlled by the bootstrap controller 114-1, a second set of switches 126-1, ..., 126-N, and a third set of switches 136-1, ..., 136-N. In some embodiments, each of the capacitors 112-1, ..., 112-N has a capacitance of $2^{N-1} \times C_{unit}$, where $C_{unit}$ represents unit capacitance. For example, the capacitance of the capacitor 112-1 is $C_{unit}$ (which is equivalent to 16C), the capacitance of the capacitor 112-2 is (which is equivalent to 2*16C), the capacitance of the capacitor 112-3 is $4*C_{unit}$ (which is equivalent to 4*16C), and the capacitance of the capacitor 112-N is $2^{N-1}*C_{unit}$ (which is equivalent to $2^{N-1}*16C$). In the embodiment depicted in FIG. 1, the bootstrap controller 114-1 is configured to control the switches 116-1, ..., 116-N simultaneously. The bootstrap controller 114-1 may include a processor, such as a microcontroller, a host processor, a host, a digital signal processor (DSP), or a central processing unit (CPU). Each of the resistive DACs 130-1, 130-2, 130-3, 130-4 is connected to the first voltage, $V_1$, through a respective capacitor 122-1, 122-2, 122-3, or 122-4. In the embodiment depicted in FIG. 1, each of the resistive DACs 130-1, 130-2, 130-3, 130-4 is connected to a switch 146-1, 146-2, 146-3, or 146-4, respectively. The switches 146-1, 146-2, 146-3, 146-4 are controlled by the bootstrap controller 114-1. In some embodiments, each of the capacitors 122-1, 122-2, 122-3, 122-4 has a unit capacitance, which is identical with the capacitance value of the capacitor 112-1. For example, each of the capacitors 122-1, 122-2, 122-3, 122-4 has a capacitance of $C_{unit}$ (which is equivalent to 16C), which is the same as the capacitance of the capacitor 112-1. Switching circuits 146-1, 146-2, 146-3, 146-4 (e.g., transmission gates) within the first DAC unit 102-1 may not function properly under certain voltage ranges. In the embodiment depicted in FIG. 1, multiple resistive DACs 130-1, 130-2, 130-3, 130-4 are connected to multiple capacitors 122-1, 122-2, 122-3, 122-4. Compared to using a single resistive DAC connected to a single capacitive unit capacitor, using multiple resistive DACs 130-1, 130-2, 130-3, 130-4 connected to multiple capacitors 122-1, 122-2, 122-3, 122-4 can circumvent an undesirable voltage range to promote reliable operations of switching circuits (e.g., transmission gates). In some embodiments, the resistive DACs 130-1, 130-2, 130-3, 130-4 are implemented on a single substrate (e.g., integrated into one IC chip). In these embodiments, the capacitive DAC 120-1 may be implemented on another substrate (e.g., integrated into another IC chip). In the embodiment depicted in FIG. 1, the switches 116-1, ..., 116-N, 146-1, 146-2, 146-3, 146-4 are connected to the input voltage, $V_{IN+}$, of the ADC, the switches 126-1, ..., 126-N are connected to a reference voltage, $V_{refN}$, and the switches 136-1, ..., 136-N are connected to a reference voltage, $V_{refP}$. Although the first DAC unit is shown with certain components and described with certain functionality herein, other embodiments of the first DAC unit may include fewer or more components to implement the same, less, or more functionality. For example, although the first DAC unit is shown in FIG. 1 as including four resistive DACs, in other embodiments, the first DAC unit may include more than four resistive DACs or less than four resistive DACs, for example, to implement different conversion precision. In another example, although the first DAC unit is shown in FIG. 1 as including one capacitive DAC, in other embodiments, the first DAC unit may include more than one capacitive DAC, for example, to implement different conversion precision. Although the bootstrap controller 114-1 is shown in FIG. 1 as being a component of the first DAC unit, in other embodiments, the bootstrap controller 114-1 is external to the first DAC unit (e.g., located at a separate IC chip from the first DAC unit).

The second DAC unit 102-2 of the ADC 100 is configured to convert a digital code that is generated by the logic circuit 106 to a second voltage, $V_2$, in response to an input voltage, $V_{IN-}$, of the ADC. In the embodiment depicted in FIG. 1, the second DAC unit 102-2 is a hybrid DAC unit that includes a capacitive DAC 120-2 and four resistive DACs 130-5, 130-6, 130-7, 130-8. In the embodiment depicted in FIG. 1, the capacitive DAC 120-2 and the four resistive DACs 130-5, 130-6, 130-7, 130-8 perform conversation for different bit sections/position of a digital sequence. For example, the capacitive DAC 120-2 performs MSB conversion and the four resistive DACs 130-5, 130-6, 130-7, 130-8 perform LSB conversion. The capacitive DAC includes a set of capacitors 152-1, ..., 152-N, where N is an integer that is greater than one, a bootstrap controller 114-2, a fourth set of switches 156-1, ..., 156-N that are controlled by the bootstrap controller 114-2, a fifth set of switches 166-1, ..., 166-N, and a sixth set of switches 176-1, ..., 176-N. In some embodiments, each of the capacitors 152-1, ..., 115-N has a capacitance of $2^{N-1} \times C_{Unit}$, where $C_{unit}$ represents unit capacitance. For example, the capacitance of the capacitor 152-1 is $C_{unit}$ (which is equivalent to 16C), the capacitance of the capacitor 152-2 is $2*C_{unit}$ (which is equivalent to 2*16C), the capacitance of the capacitor 152-3 is $4*C_{unit}$ (which is equivalent to 4*16C), and the capacitance of the capacitor 152-N is $2^{N-1}*C_{unit}$ (which is equivalent to $2^{N-1}*16C$). In the embodiment depicted in FIG. 1, the bootstrap controller 114-2 is configured to control the switches 156-1, ..., 156-N simultaneously. The bootstrap controller 114-4 may include a processor, such as a microcontroller, a host processor, a host, a DSP, or a CPU. Each of the resistive DACs 130-5, 130-6, 130-7, 130-8 is connected to the second voltage, $V_2$, through a respective capacitor 162-1, 162-2, 162-3, or 162-4. In the embodiment depicted in FIG. 1, each of the resistive DACs 130-5, 130-6, 130-7, 130-8 is connected to a switch 186-1, 186-2, 186-3, or 186-4, respectively. The switches 186-1, 186-2, 186-3, 186-4 are controlled by the bootstrap controller 114-2. In some embodiments, each of the capacitors 162-1, 162-2, 162-3, 162-4 has a unit capacitance, which is identical with the capacitance value of the capacitor 152-1. For example, each of the capacitors 162-1, 162-2, 162-3, 162-4 has a capacitance of $C_{unit}$ (which is equivalent to 16C), which is the same as the capacitance of the capacitor 152-1. Switching circuits 146-1, 146-2, 146-3, 146-4 (e.g., transmission gates) within the first DAC unit 102-1 may not function properly under certain voltage ranges. In the embodiment depicted in FIG. 1, multiple resistive DACs 130-5, 130-6, 130-7, 130-8 are connected to multiple capacitors 162-1, 162-2, 162-3, or 162-4. Compared to using a single resistive DAC connected to a single capacitive unit capacitor, using multiple resistive DACs 130-5, 130-6, 130-7, 130-8 connected to multiple capacitors 162-1, 162-2, 162-3, or 162-4 can circumvent an undesirable voltage range to promote reliable operations of switching circuits (e.g., transmission gates). In some embodiments, the resistive DACs 130-5, 130-6, 130-7, 130-8 are implemented on a single substrate (e.g., integrated into one IC chip). In these embodiments, the capacitive DAC 120-2 may be implemented on another substrate (e.g., integrated into another IC chip). In the embodiment depicted in FIG. 1, the switches 156-1, ..., 156-N, 186-1, 186-2, 186-3, 186-4 are connected to the input voltage, $V_{IN-}$, of the ADC, the switches 166-1, ..., 166-N are connected to the reference voltage, $V_{refN}$, and the switches 176-1, ..., 176-N are connected to the reference voltage, $V_{refP}$. Although the second DAC unit is shown with certain components and described with certain functionality herein, other embodiments of the second DAC unit may include fewer or more components to implement the same, less, or more functionality. For example, although the second DAC unit is shown in FIG. 1 as including four resistive DACs, in other embodiments, the second DAC unit may include more than four resistive DACs or less than four resistive DACs, for example, to implement different conversion precision. In another example, although the second DAC unit is shown in FIG. 1 as including one capacitive DAC, in other embodiments, the second DAC unit may include more than one capacitive DAC, for example, to implement different conversion precision. Although the bootstrap controller 114-2 is shown in FIG. 1 as being a component of the second DAC unit, in other embodiments, the bootstrap controller 114-2 is external to the second DAC unit (e.g., located at a separate IC chip from the second DAC unit). In the embodiment depicted in FIG. 1, the ADC 100 is a differential DAC that includes the first and second DAC units configured to convert the digital code that is generated by the logic circuit to the first voltage, $V_1$, and the second voltage, $V_2$, response to the input voltage, $V_{IN+}$, of the ADC and the input voltage, $V_{IN-}$, of the ADC. However, in other embodiments, the ADC may include only the first DAC unit or only the second DAC unit. In these embodiments, a reference voltage is supplied to the comparator for voltage comparison with a voltage that is generated by the first DAC unit or the second DAC unit.

Figure 2:
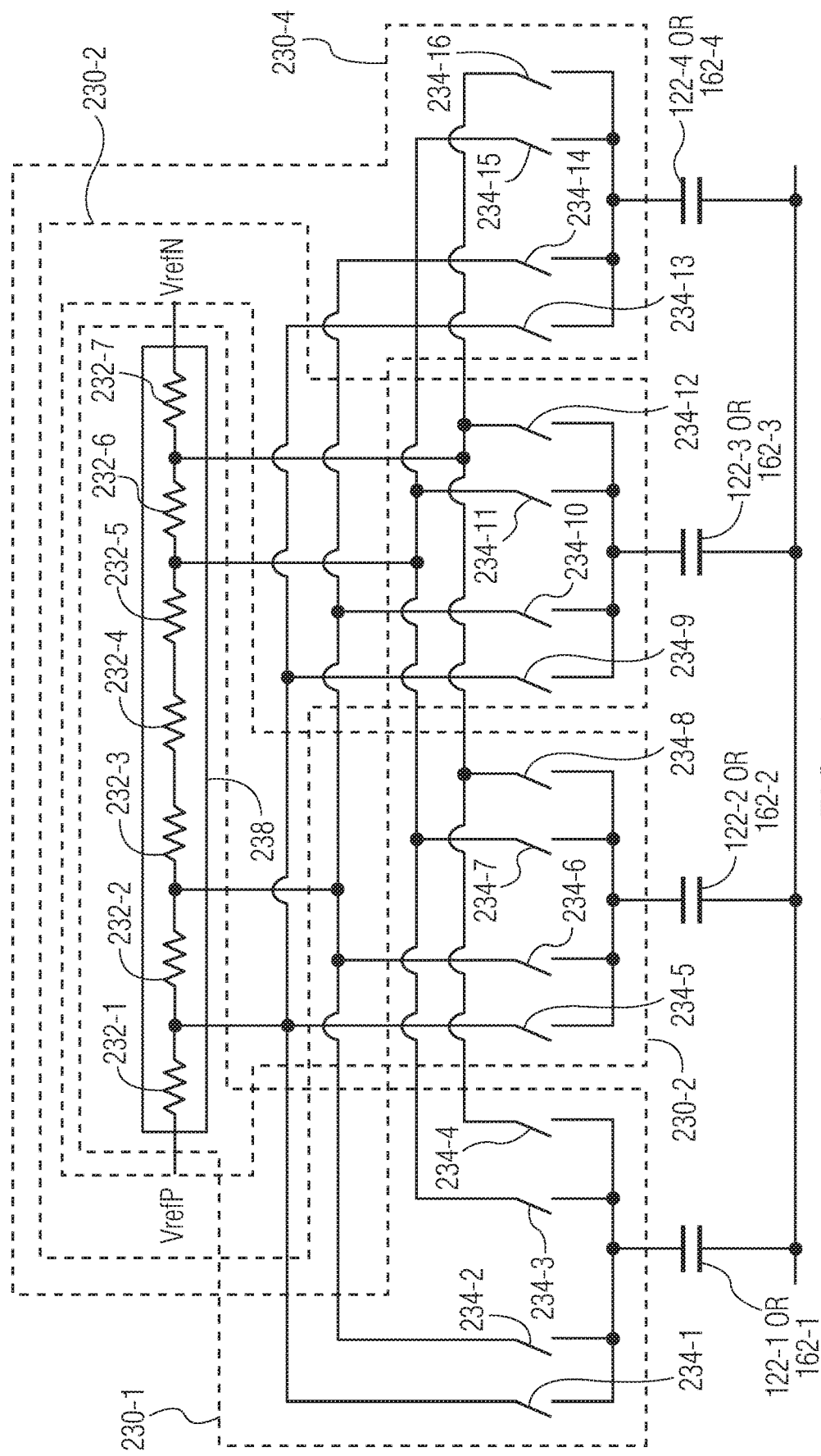
FIG. 2 depicts some embodiments of resistive DACs of the ADC depicted in FIG. 1.

FIG. 2 depicts resistive DACs 230-1, 230-2, 230-3, 230-4, which are embodiments of the resistive DACs 130-1, 130-2, 130-3, 130-4 of the first DAC unit 102-1 or embodiments of the resistive DACs 130-5, 130-6, 130-7, 130-8 of the second DAC unit 102-2 depicted in FIG. 1. However, the resistive DACs depicted in FIG. 1 are not limited to the embodiments shown in FIG. 2. In the embodiment depicted in FIG. 2, the resistive DACs 230-1, 230-2, 230-3, 230-4 share a resistor ladder 238 that includes seven resistors 232-1, 232-2, 232-3, 232-4, 232-5, 232-6, 232-7. Compared to using parallel resistors in resistive DACs, using the resistor ladder or resistive ladder in the resistive DACs 230-1, 230-2, 230-3, 230-4 can produce a more stable reference current, which results in a more stable output voltage. By sharing the resistor ladder 238 between the resistive DACs 230-1, 230-2, 230-3, 230-4, multiple resistive DAC outputs can be made from a single resistor ladder, which may reduce power consumption and may reduce substrate area. Each of the resistive DACs 230-1, 230-2, 230-3, 230-4 includes four switches 234-1, 234-2, 234-3, 234-4, four switches 234-5, 234-6, 234-7, 234-8, four switches 234-9, 234-10, 234-11, 234-12, or four switches 234-13, 234-14, 234-15, 234-16 that are connected to the first voltage, $V_1$, through a respective capacitor, which may be one of the capacitors 122-1, 122-2, 122-3, 122-4,162-1, 162-2, 162-3, 162-4. Specifically, the switch 234-1, 234-5, 234-9, or 234-13 is connected between the resistors 232-1, 232-2, the switch 234-2, 234-6, 234-10, or 234-14 is connected between the resistors 232-2, 232-3, the switch 234-3, 234-7, 234-11, or 234-15 is connected between the resistors 232-5, 232-6, and the switch 234-4, 234-8, 234-12, or 234-16 is connected between the resistors 232-6, 232-7. Although the illustrated resistive DAC 230 is shown with certain components and described with certain functionality herein, other embodiments of the resistive DAC may include fewer or more components to implement the same, less, or more functionality. For example, the resistor ladder of the resistive DAC may include more than seven resistors or less than seven resistors. In another example, the resistive DAC may include more than four switches or less than four switches.

Figure 3:
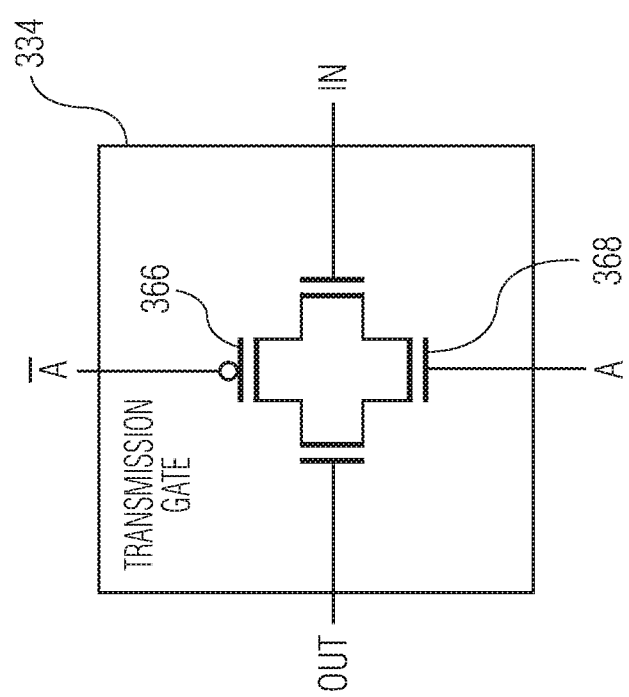
FIG. 3 depicts an embodiment of switches of the resistive DACs depicted in FIG. 2.

FIG. 3 depicts a transmission gate 334, which is an embodiment of the switches 234-1, 234-2, 234-3, 234-4, 234-5, 234-6, 234-7, 234-8, 234-9, 234-10, 234-11, 234-12, 234-13, 234-14, 234-15, 234-16 of the resistive DACs 230-1, 230-2, 230-3, 230-4 depicted in FIG. 2. However, the switches 234-1, 234-2, 234-3, 234-4, 234-5, 234-6, 234-7, 234-8, 234-9, 234-10, 234-11, 234-12, 234-13, 234-14, 234-15, 234-16 depicted in FIG. 2 are not limited to the embodiment shown in FIG. 3. In the embodiment depicted in FIG. 3, the transmission gate includes a PMOS transistor 366 and an NMOS transistor 368. The transmission gate is active when the NMOS transistor and the PMOS transistor are both enabled. Ideally, when the input voltage (IN) is lower than a low threshold, the NMOS transistor is enabled or conducts, when the input voltage (IN) is higher than a high threshold, the PMOS transistor is enabled or conducts, and when the input voltage (IN) is between the low threshold and the high threshold, both the NMOS transistor and the PMOS transistor are enabled or conduct. However, in modern processes, the threshold voltage of MOSFET devices can be high such that for voltage inputs between the low threshold and the high threshold, neither the NMOS transistor nor the PMOS transistor is sufficiently conducting. For example, for a 4-bit resistor ladder DAC, voltage produced by the 4-bit resistor ladder DAC may not be within a desirable voltage range (e.g., an operable voltage range) of an NMOS transistor and/or a PMOS transistor. Table 1 includes example voltage outputs of a 4-bit resistor ladder DAC and conducting patterns of an NMOS transistor and a PMOS transistor under ideal condition and practical condition. As presented in Table 1, neither the NMOS transistor nor the PMOS transistor conducts during voltage output between 6 and 10.

TABLE 1

| Resistor ladder DAC Output | Conducting element under ideal condition | Conducting element in practical condition |
| --- | --- | --- |
| 0 | NMOS | NMOS |
| 1 | NMOS | NMOS |
| 2 | NMOS | NMOS |
| 3 | NMOS | NMOS |
| 4 | NMOS | NMOS |
| 5 | NMOS | NMOS |
| 6 | Both | Neither |

TABLE 1-continued

| Resistor ladder DAC Output | Conducting element under ideal condition | Conducting element in practical condition |
| --- | --- | --- |
| 7 | Both | Neither |
| 8 | Both | Neither |
| 9 | Both | Neither |
| 10 | Both | Neither |
| 11 | PMOS | PMOS |
| 12 | PMOS | PMOS |
| 13 | PMOS | PMOS |
| 14 | PMOS | PMOS |
| 15 | PMOS | PMOS |

Turning back to FIG. 2, using multiple resistive DACs 230-1, 230-2, 230-3, 230-4 connected to multiple capacitors 222-1, 222-2, 222-3, 222-4 can circumvent an inoperable voltage range such that transmission gates 334 can be used within an operable voltage range. In the embodiment depicted in FIG. 2, the resistive DACs 230-1, 230-2, 230-3, 230-4 share the resistor ladder 238 such that that the midpoint of the resistor ladder (i.e., the point between the resistors 232-3, 232-4 or the point between the resistors 232-3, 232-4) is not connected to the resistive DACs 230-1, 230-2, 230-3, 230-4. The resistive DACs 230-1, 230-2, 230-3, 230-4 are used for LSB conversions of different bit positions. In some embodiments, the resistive DACs 230-1, 230-2, 230-3, 230-4 are used for LSB+3 conversion, LSB+2 conversion, LSB+1 conversion, LSB conversion, respectively. Table 2 includes example voltage outputs of the resistor ladder and LSB bit values. For example, when LSB+3 needs to be set high, the output of the resistive DAC 230-1 for LSB+3 is set to 12, while when LSB+3 needs to be set low, the output of the resistive DAC 230-1 for LSB+3 set to 4 since the LSB+3 bit has a weight of 8. Voltage output between 6 and 10 are not used, and consequently, transmission gates (e.g., the transmission gate 334 of FIG. 3) can continuously conduct in operable voltage range.

TABLE 2

| Ladder output tap | DAC LSB + 3 | DAC LSB + 2 | DAC LSB + 1 | DAC LSB |
| --- | --- | --- | --- | --- |
| 0 | | selected when LSB + 2 = 0 | selected when LSB + 1 = 0 | selected when LSB = 0 |
| 1 | | | | selected when LSB = 1 |
| 2 | | | selected when LSB + 1 = 1 | |
| 3 | | | | |
| 4 | selected when LSB + 3 = 0 | selected when LSB + 2 = 1 | | |
| 5 | | | | |
| 6 | | | | |
| 7 | | | | |
| 8 | | | | |
| 9 | | | | |
| 10 | | | | |
| 11 | | | | |
| 12 | selected when LSB + 3 = 1 | | | |
| 13 | | | | |
| 14 | | | | |
| 15 | | | | |

In some embodiments, the resistive DACs 230-1, 230-2, 230-3, 230-4 are connected to the first voltage, $V_1$, or to the second voltage, $V_2$, through shared capacitors, which results in a reduction in the total number of capacitors used. For example, the resistive DACs 230-1, 230-3 are connected to the first voltage, $V_1$, or to the second voltage, $V_2$, through a first capacitor while the resistive DACs 230-2, 230-4 are connected to the first voltage, $V_1$, or to the second voltage, $V_2$, through a second capacitor. Table 3 includes example voltage outputs of the resistor ladder 238 and LSB bit values. In the example presented in Table 3, the resistive DACs 230-1, 230-2, 230-3, 230-4 are used for LSB+3 conversion, LSB+2 conversion, LSB+1 conversion, LSB conversion, respectively. As presented in Table 3, the code for LSB+3, LSB+2, LSB+1, LSB is '0110', the resistive DAC 230-1 selects output 5 and the resistive DAC 230-2 selects output 4.

TABLE 3

| Ladder output tap | DAC LSB + 3 and LSB + 1 | DAC LSB + 2 and LSB |
|---|---|---|
| 0 | | =00 |
| 1 | | =01 |
| 2 | | |
| 3 | =00 | |
| 4 | | =10 |
| 5 | =01 | =11 |
| 6 | | |
| 7 | | |
| 8 | | |
| 9 | | |
| 10 | | |
| 11 | =10 | |
| 12 | | |
| 13 | =11 | |
| 14 | | |
| 15 | | |

Turning back to FIG. 1, the comparator 104 is configured to compare the first voltage, $V_1$, which is generated by the first DAC unit 102-1 with the second voltage, $V_2$, which is generated by the second DAC unit 102-2 to generate a comparison output. In the embodiment depicted in FIG. 1, the comparator includes an amplifier 167 configured to compare the first voltage, $V_1$, with the second voltage, $V_2$, to generate a comparison result, for example, by amplifying the voltage difference between the first voltage, $V_1$, with the second voltage, $V_2$, and a latch circuit 169 configured to store the comparison result.

In the embodiment depicted in FIG. 1, the logic circuit 106 is configured to generate the digital code, to control the first DAC unit 102-1 and/or the second DAC unit 102-2 based on the comparison output, and to output the digital code as a digital output of the ADC 100. The logic circuit may be configured to control one or all of the switches 116-1, . . . , 116-N, the switches 126-1, . . . , 126-N, the switches 136-1, . . . , 136-N, the switches 146-1, 146-2, 146-3, 146-4, the switches 156-1, . . . , 156-N, the switches 166-1, . . . , 166-N, the switches 176-1, . . . , 176-N, and the switches 186-1, 186-2, 186-3, 186-4. Although the logic circuit is shown in FIG. 1 as connected to the switches 116-1, . . . , 116-N, the switches 126-1, . . . , 126-N, the switches 136-1, . . . , 136-N, the switches 146-1, 146-2, 146-3, 146-4, the switches 156-1, . . . , 156-N, the switches 166-1, . . . , 166-N, the switches 176-1, . . . , 176-N, and the switches 186-1, 186-2, 186-3, 186-4 in certain manner, in other embodiments, the logic circuit is connected to the switches 116-1, . . . , 116-N, the switches 126-1, . . . , 126-N, the switches 136-1, . . . , 136-N, the switches 146-1, 146-2, 146-3, 146-4, the switches 156-1, . . . , 156-N, the switches 166-1, . . . , 166-N, the switches 176-1, . . . , 176-N, and the switches 186-1, 186-2, 186-3, 186-4 differently. In some embodiments, the logic circuit is connected to each of the switches 116-1, . . . , 116-N, the switches 126-1, . . . , 126-N, the switches 136-1, . . . , 136-N, the switches 146-1, 146-2, 146-3, 146-4, the switches 156-1, . . . , 156-N, the switches 166-1, . . . , 166-N, the switches 176-1, . . . , 176-N, and the switches 186-1, 186-2, 186-3, 186-4 in a different connection or link. The logic circuit may include a processor, such as a microcontroller, a host processor, a host, a DSP, or a CPU. In some embodiments, the logic circuit includes one or more register circuits that are configured to store at least part of the digital code before the digital code is output.

In the embodiment depicted in FIG. 1, the voltage generator 108 is configured to generate a voltage for switches 196-1, 196-2. In some embodiments, the voltage generator includes a voltage source that is configured to generate a constant voltage. In some embodiments, the ADC 100 includes a bootstrap controller 124 is configured to control both of the switches 196-1, 196-2 simultaneously. In an embodiment, the bootstrap controller includes a processor, such as a microcontroller, a host processor, a host, a DSP, or a CPU.

Figure 4:
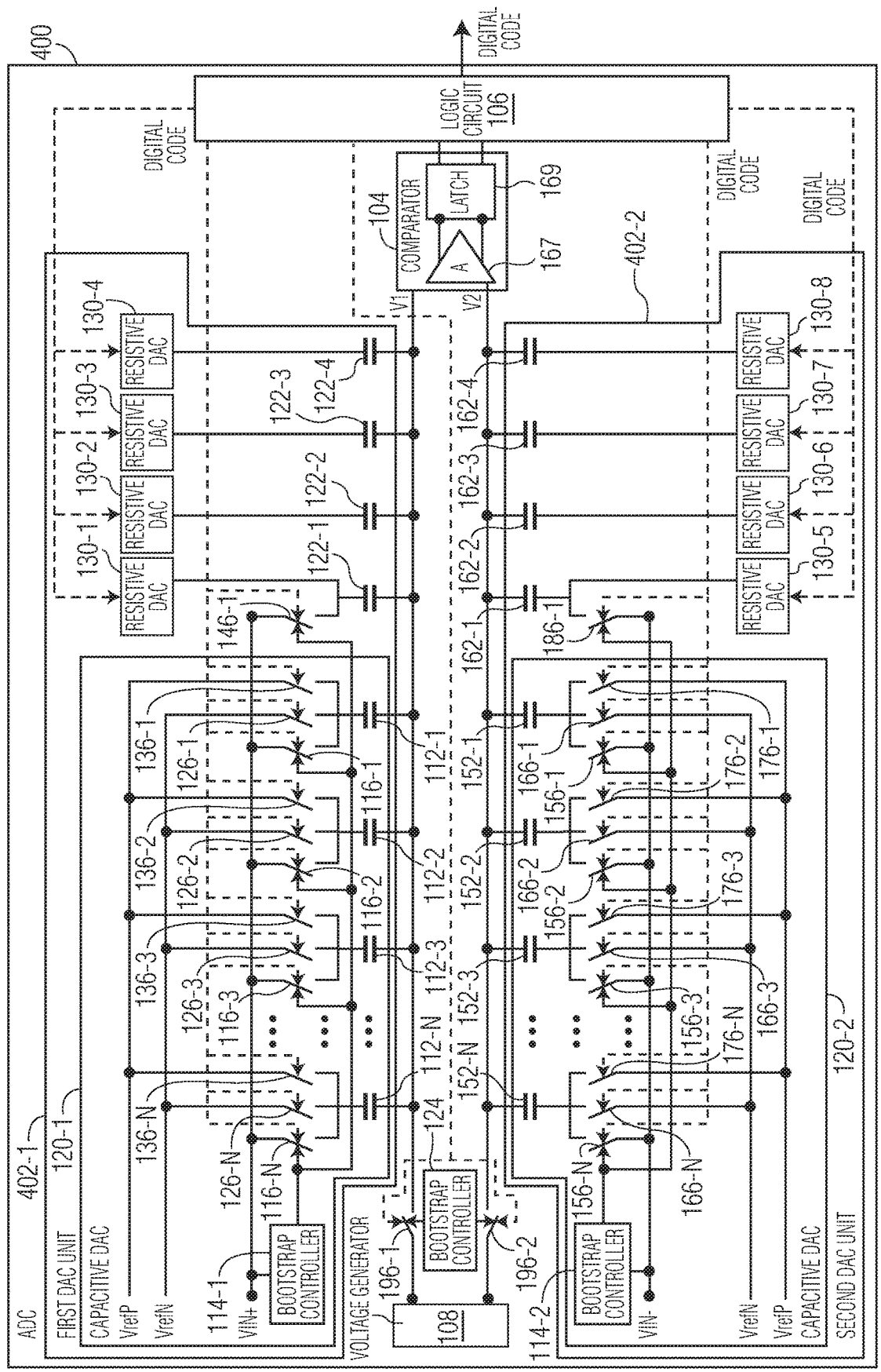
FIG. 4 depicts an ADC in which one switch connected to resistive DACs is sampled in accordance with an embodiment of the invention.

In some embodiments, sampling all of the switches 146-1, 146-2, 146-3, 146-4 connected to the resistive DACs 130-1, 130-2, 130-3, 130-4 or all of the switches 186-1, 186-2, 186-3, 186-4 connected to the resistive DACs 130-5, 130-6, 130-7, 130-8 can affect gain accuracy of the ADC 100. Instead of sampling all of the switches 146-1, 146-2, 146-3, 146-4 or all of the switches 186-1, 186-2, 186-3, 186-4, sampling one of the switches 146-1, 146-2, 146-3, 146-4 or the switches 186-1, 186-2, 186-3 can improve ADC gain accuracy. FIG. 4 depicts an ADC 400 in which a single switch connected to resistive DACs is sampled in accordance with an embodiment of the invention. In the embodiment depicted in FIG. 4, the ADC 400 includes a first DAC unit 402-1, a second DAC unit 402-2, the comparator 104, the logic circuit 106, and the voltage generator 108. A difference between the ADC 400 depicted in FIG. 4 and the ADC 100 depicted in FIG. 1 is that a single switch is connected between resistive DACs and a respective capacitive DAC of the first and second DAC unit 402-1, 402-2. Specifically, the first DAC unit 402-1 is a hybrid DAC unit that includes a capacitive DAC 120-1 and four resistive DACs 130-1, 130-2, 130-3, 130-4, which are connected to the capacitive DAC 120-1 through the switch 146-1, and the second DAC unit 402-2 is a hybrid DAC unit that includes a capacitive DAC 120-2 and four resistive DACs 130-5, 130-6, 130-7, 130-8, which are connected to the capacitive DAC 120-2 through the switch 186-1. Compared to the ADC 100 depicted in FIG. 1, the ADC 400 depicted in FIG. 4 has a higher gain accuracy. For example, if the ADC 100 is a 12-bit DAC, a total of 4144 unit capacitance is sampled while the DAC 100 still has a range of 4095 unit capacitance, which results in a gain offset of over 1% or the gain accuracy degradation by 48 LSBs. If the ADC 400 depicted in FIG. 4 is a 12-bit DAC, a total of 4096 unit capacitance is sampled while the DAC 400 has a range of 4095 unit capacitance, which results in higher gain accuracy than the ADC 100 of FIG. 1.

Figure 5:
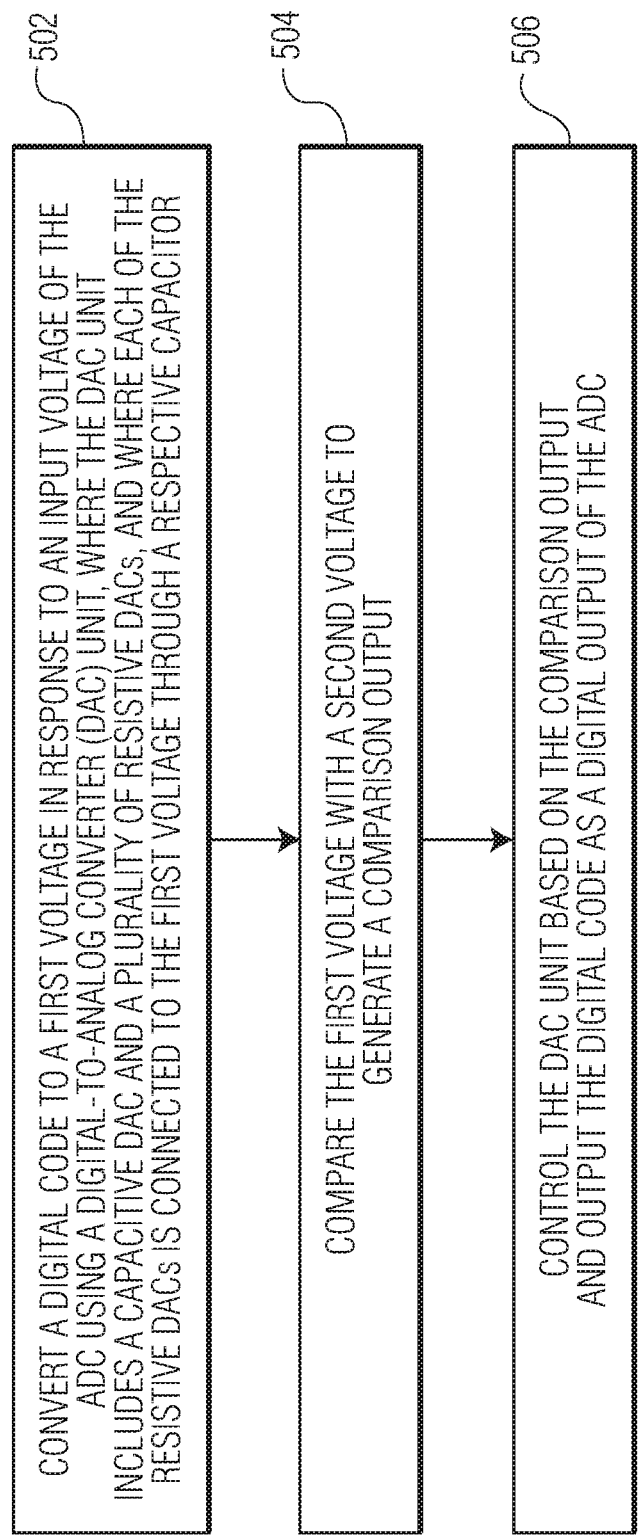
FIG. 5 is a process flow diagram of a method of operating an ADC in accordance to an embodiment of the invention.

FIG. 5 is a process flow diagram of a method for operating an ADC in accordance to an embodiment of the invention. According to the method, at block 502, a digital code is converted to a first voltage in response to an input voltage of the ADC using a DAC unit, where the DAC unit includes a capacitive DAC and a plurality of resistive DACs, and where each of the resistive DACs is connected to the first voltage through a respective capacitor. At block 504, the first voltage is compared with a second voltage to generate a comparison output. At block 506, the DAC unit is controlled based on the comparison output, and the digital code is output as a digital output of the ADC. The ADC may be similar to, the same as, or a component of the ADC 100 depicted in FIG. 1 and/or the ADC 400 depicted in FIG. 4.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD). Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An analog-to-digital converter (ADC), the ADC comprising:
   a digital-to-analog converter (DAC) unit configured to convert a digital code to a first voltage in response to an input voltage of the ADC,
   wherein the DAC unit comprises
      a capacitive DAC and
      a plurality of resistive DACs, and
   wherein each of the resistive DACs is connected to the first voltage through a respective capacitor;
   a comparator configured to compare the first voltage with a second voltage to generate a comparison output; and
   a logic circuit configured
      to generate the digital code,
      to control the DAC unit based on the comparison output, and
      to output the digital code as a digital output of the ADC;
   wherein the capacitive DAC comprises a plurality of switches connected to the input voltage of the ADC or a reference voltage of the ADC and a plurality of capacitors connected between the switches and the first voltage.

2. The ADC of claim 1,
   wherein the resistive DACs share a resistor ladder.

3. The ADC of claim 2,
   wherein the resistive DACs are connected to the capacitive DAC through a plurality of switches.

4. The ADC of claim 2,
   wherein the resistive DACs are connected to the capacitive DAC through a single switch.

5. The ADC of claim 2,
   wherein each of the resistive DACs comprises a plurality of transmission gates connected to different resistors of the resistor ladder.

6. The ADC of claim 5,
   wherein each of the transmission gates comprises an NMOS transistor and a PMOS transistor.

7. The ADC of claim 1,
   wherein the capacitive DAC is configured to performs most significant bit (MSB) conversion of the digital code.

8. The ADC of claim 7,
   wherein the resistive DACs are configured to perform least significant bit (LSB) conversion of the digital code.

9. The ADC of claim 1,
   wherein the capacitive DAC further comprises a bootstrap controller configured to control some of the switches simultaneously.

10. The ADC of claim 1,
   further comprising a second DAC unit configured to convert the digital code to the second voltage in response to the input voltage of the ADC,
   wherein the second DAC unit comprises a second capacitive DAC and a second set of resistive DACs, and
   wherein each of the second set of resistive DACs is connected to the second voltage through a respective capacitor.

11. The ADC of claim 10,
   wherein the second set of resistive DACs share a second resistor ladder.

12. The ADC of claim 11,
   wherein the second set of resistive DACs are connected to the capacitive DAC through a plurality of switches.

13. The ADC of claim 11,
   wherein the second set of resistive DACs are connected to the capacitive DAC through a single switch.

14. The ADC of claim 11,
   wherein each of the second set of resistive DACs comprises a plurality of transmission gates connected to different resistors of the second resistor ladder.

15. The ADC of claim 14,
   wherein each of the transmission gates comprises an NMOS transistor and a PMOS transistor.

16. The ADC of claim 1,
   wherein the ADC is a successive-approximation-register (SAR) ADC.

17. A method for operating an analog-to-digital converter (ADC), the ADC comprising:
   converting a digital code to a first voltage in response to an input voltage of the ADC using a digital-to-analog converter (DAC) unit,
   wherein the DAC unit comprises
      a capacitive DAC and
      a plurality of resistive DACs, and
   wherein each of the resistive DACs is connected to the first voltage through a respective capacitor;
   comparing the first voltage with a second voltage to generate a comparison output using a comparator;

generating the digital code using a logic circuit;
controlling the DAC unit based on the comparison output using the logic circuit; and
outputting the digital code as a digital output of the ADC using the logic circuit;
wherein the capacitive DAC comprises a plurality of switches connected to the input voltage of the ADC or a reference voltage of the ADC and a plurality of capacitors connected between the switches and the first voltage.

18. The method of claim 17, wherein the ADC is a successive-approximation-register (SAR) ADC.

19. An analog-to-digital converter (ADC), the ADC comprising:
a digital-to-analog converter (DAC) unit configured to convert a digital code to a first voltage in response to an input voltage of the ADC,
wherein the DAC unit comprises
a capacitive DAC and
a plurality of resistive DACs, and
wherein each of the resistive DACs is connected to the first voltage through a respective capacitor;
a comparator configured to compare the first voltage with a second voltage to generate a comparison output; and
a logic circuit configured
to generate the digital code,
to control the DAC unit based on the comparison output, and
to output the digital code as a digital output of the ADC;
further comprising a second DAC unit configured to convert the digital code to the second voltage in response to the input voltage of the ADC;
wherein the second DAC unit comprises a second capacitive DAC and a second set of resistive DACs; and
wherein each of the second set of resistive DACs is connected to the second voltage through a respective capacitor.

* * * * *